United States Patent [19]

Reno

[11] Patent Number: 5,629,635

[45] Date of Patent: May 13, 1997

[54] ADDRESS PROGRAMMING VIA LED PIN

[75] Inventor: T. Kevin Reno, Frederick, Md.

[73] Assignee: ICS Technologies, Inc., Valley Forge, Pa.

[21] Appl. No.: 533,962

[22] Filed: Sep. 26, 1995

[51] Int. Cl.[6] .................... H03K 19/173; H03K 19/0175
[52] U.S. Cl. .................... 326/38; 326/46; 326/82
[58] Field of Search ............... 326/37–38, 39–40, 326/46, 58, 56, 82, 86

[56] References Cited

U.S. PATENT DOCUMENTS

| | | | |
|---|---|---|---|
| 3,246,162 | 4/1966 | Chin | 250/211 |
| 3,492,659 | 1/1970 | Lee | 340/173 |
| 3,609,711 | 9/1971 | Gunn | 340/173 R |
| 3,609,713 | 9/1971 | Wooton et al. | 340/173 LM |
| 3,631,411 | 12/1971 | Kosonocky | 340/170 LS |
| 3,801,966 | 4/1974 | Terao | 340/173 LM |
| 4,727,514 | 2/1988 | Bhuva et al. | 365/104 |
| 4,783,606 | 11/1988 | Goetting | 326/38 |
| 4,857,770 | 8/1989 | Partovi et al. | 326/58 |
| 4,887,241 | 12/1989 | Tran | 365/230 |
| 5,051,622 | 9/1991 | Pleva | 326/38 |
| 5,191,243 | 3/1993 | Shen et al. | 326/37 |
| 5,198,707 | 3/1993 | Nicolai | 326/98 |
| 5,247,631 | 9/1993 | Hilton et al. | 395/400 |
| 5,317,210 | 5/1994 | Patel | 326/40 |
| 5,336,951 | 8/1994 | Josephson et al. | |
| 5,412,260 | 5/1995 | Tsui et al. | 326/39 |
| 5,477,166 | 12/1995 | Matthews | 326/38 |

*Primary Examiner*—Edward P. Westin
*Assistant Examiner*—Jon Santamauro
*Attorney, Agent, or Firm*—Townsend and Townsend and Crew LLP

[57] ABSTRACT

An LED driver pin which can be used for programming a memory element in a first mode, and can be used for driving the LED in a second mode is provided. The invention includes the pin and the LED driver connected to the pin, and additionally provides an input buffer for receiving the programmable input signal. The programmable memory element is connected to the input buffer, and a control circuit is provided for enabling the input of a voltage on the pin to the programmable memory element during the first mode, and enabling the LED driver to function during a second mode.

14 Claims, 1 Drawing Sheet

ADDRESS PROGRAMMING VIA LED PIN

BACKGROUND OF THE INVENTION

The present invention relates to both dual use pins on an integrated circuit and to LED driver circuits.

As the size of integrated circuits (ICs) has decreased with advancing process technology, one limiting factor on the production of integrated circuits is the number of pins required to connect to the IC. There have been a large number of techniques used to keep the pin count down such that only necessary signals are used for pins. In addition, dual usage of pins is often implemented. For example, one pin might serve as an addressing pin at a first period in time, and subsequently function as the data output pin for the data which was addressed. Such multiplexing techniques are common.

In addition, pins can be used for programming an integrated circuit during an initial, start-up or programming mode. Subsequently, the pins can be used for normal functional input\output (I\O) during the functional usage of the IC. Examples of such circuits are set forth, for example, in U.S. Pat. No. 5,336,951 and U.S. Pat. No. 4,727,514.

One particular usage of a pin on an IC is to drive a light-emitting diode (LED) or other light-emitting device. Many electronic devices provide indicator lights to provide feedback to the user on the operation of the electronic device. Thus, pins are often dedicated to this function of driving the light-emitting diodes, which typically are not on the chip itself both because of their size and heat generation, and because of the need to locate them on the external chassis of the device where they can be viewed by the user, thus requiring a connection line between them and the IC.

Oftentimes, in more complicated systems, multiple ICs having LED drive pins may be connected to a single addressable management entity which activates the LEDs for different purposes in accordance with addresses assigned to the LEDs. Thus, each IC must determine whether an address is intended for its LED driver, and act appropriately.

SUMMARY OF THE INVENTION

The present invention provides an LED driver pin which can be used for programming a memory element in a first mode, and can be used for driving the LED in a second mode. The invention includes the pin and the LED driver connected to the pin, and additionally provides an input buffer for receiving the programmable input signal. The programmable memory element is connected to the input buffer, and a control circuit is provided for enabling the input of a voltage on the pin to the programmable memory element during the first mode, and enabling the LED driver to function during a second mode.

In a preferred embodiment, the memory element is associated with the LED driver itself, to indicate what type of LED driver (source or sink) is to be activated. The programming mode is preferably the power-on reset mode. The control circuitry enables either an input to the addressable memory element in response to a power-on reset signal, or enables the output of the addressable memory element to activate one of two different LED drivers. A first driver will source current, while a second driver will sink current. The selection of the sourcing or sinking is dictated by the input programming voltage, which will indicate whether an external LED is connected to ground or to a positive voltage supply.

The preferred embodiment of the present invention not only enables the programming of an LED driver without the use of an additional programming pin, but also allows the programming to be accomplished automatically upon connecting of the LED either to ground or to positive voltage. Thus, the programming connection can be left in place during normal operation of the IC. The IC, in response to programming, selects the appropriate voltage output (current sinking or current sourcing) to operate the LED as connected.

In a preferred embodiment, the control circuit is implemented with boolean logic gates. These logic gates have a programmable input in both normal and inverted form, and the power-on reset as an input. The outputs are connected to the programmable address register. The second portion of the boolean logic connects between the output of the programmable address register, which is both inverted and non-inverted, and the drive inputs of the LED drive transistors alternately connected to positive voltage or ground.

For a further understanding of the nature and advantages of the invention, reference should be made to the ensuing detailed description taken in conjunction with the accompanying drawing.

DETAILED DESCRIPTION OF THE PREFERRED EMBODIMENTS

Figure 1:
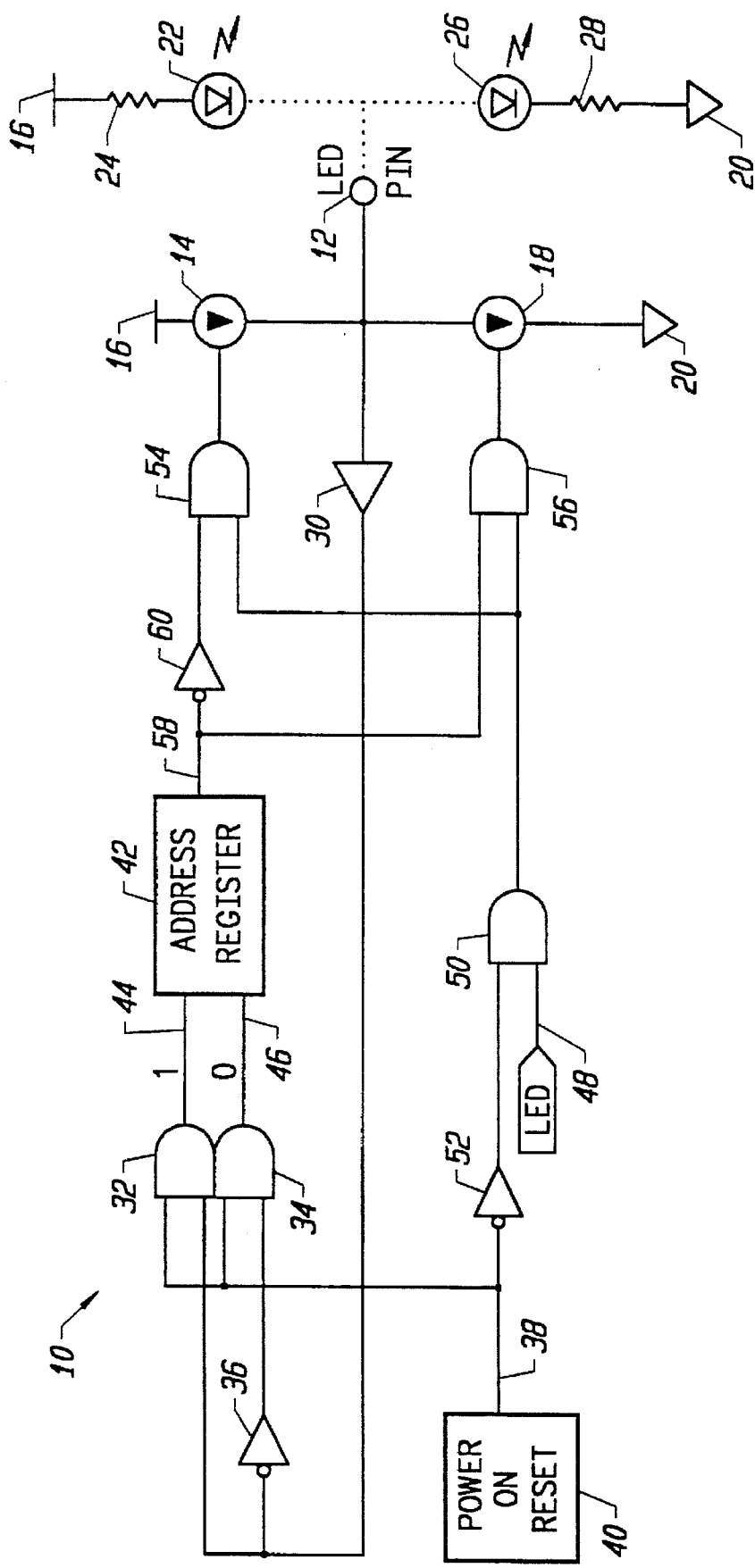
FIG. 1 is a block diagram of a programmable LED input circuit according to the present invention.

FIG. 1 shows a programmable LED driver circuit 10 according to the present invention. The LED pin 12 is shown connected to a first drive transistor 14 which is connected to a positive voltage 16. In addition, LED pin 12 is connected to a second drive transistor 18, connected to ground 20. External to the IC, there are two different possible LED configurations which are used to program the LED drive circuitry. Only one of the two configurations would be used depending upon the programming desired. In a first configuration, an LED 22 is connected through a current limiting resistor 24 to a positive voltage 16. In a second configuration, an LED 26 is connected through a resistor 28 to ground 20.

Depending upon which LED configuration is used, a different programming input will be provided to an input buffer 30. The input buffer provides a signal to a boolean logic combination, which consists in the embodiment shown of two AND gates 32 and 34. The input to AND gate 34 is inverted through an inverter 36. The second input to AND gates 32 and 34 is provided by a power-on reset line 38 with the signal provided from a power-on reset circuit 40. Thus, in operation, when power-on reset is enabled, the voltage connected to pin 12 will be provided through either AND gate 32 or 34 to an address register 42. If the value is 1, it will be provided on input line 44, while if the value is zero, it will be provided on input line 46. The value of zero or one will thus be latched into address register 42.

After the power-on reset mode, during normal functional operation, an LED control signal is provided on line 48 indicating the state of an LED. The value on line 48 either will be a zero, to deactivate the LED, or a one, to activate the LED. This signal is gated through an AND gate 50. The other input of AND gate 50 is provided from the power-on reset line 38 through an inverter 52, which disables the LED addressing during power-on reset, and enables it at all other times. When enabled, AND gate 50 will pass on the LED state from line 48 to inputs of boolean logic coupled to the output of address register 42, in this embodiment AND gates 54 and 56. The other input to AND gates 54 and 56 will be the output on line 58 of address register 42. The input to AND gate 54 is the inverted version of this output, provided through inverter 60. Thus, if address register 42 is storing a zero value, this will be inverted to a 1 by inverter 60, enabling AND gate 54, while disabling AND gate 56. Alternately, if address register 42 is storing a one value, AND gate 56 will be enabled, while AND gate 54 will be disabled. A programming value of 1 on line 48 is thus needed to activate either AND gate 54 or 56. The outputs of AND gates 54 and 56 are connected to the control inputs of LED drive transistors 14 and 18, respectively.

As can be seen, there are two possibilities for the LED being activated. In each case, a value of 1 needs to appear on LED address line 48 to activate this particular pin. Once the pin is activated by a value of 1 provided at one input of AND gates 54 and 56, a 1 value must be also applied to the other input. One of the AND gates will always have a 1 input, since one of them is inverted with inverter 60. The one that is activated must also be an AND gate which activates a drive transistor corresponding to the appropriate LED connection. Thus, if LED 26 is connected, it will only be turned on when sourcing transistor 14 is activated as determined by address register 42, which is set by the power-on reset configuration.

Alternately, if LED 22 is connected to positive voltage 16, it will only be activated when sinking transistor 18 is turned on as determined by address register 42, which is set by the power-on reset configuration.

As will be understood by those with skill in the art, the present invention may be embodied in other specific forms without departing from the spirit or essential characteristics thereof. For example, NAND gates or other boolean logic could be substituted for the logic of the present invention. Alternately, an addressing scheme which selected one of the two AND gates 54 and 56 through the use of an inverter could be used, rather than just enabling or disabling both of them. A number of alternate embodiments of the invention are possible within the scope of the invention. Reference should be made to the appended claims which set forth the scope of the invention.

What is claimed is:

1. An integrated circuit comprising:
    a pin for connecting to a LED, only a single pin being connectable to each LED;
    an LED driver connected to said pin;
    an input buffer connected to said pin;
    a programmable memory coupled to said input buffer; and
    means for enabling the input of a voltage on said pin to said programmable memory during a first mode and enabling said LED driver during a second mode, a connection of said LED providing a programming input.

2. The integrated circuit of claim 1 wherein said first mode is a power-on reset mode.

3. The integrated circuit of claim 1 further comprising a control circuit, coupled between said programmable memory and said LED driver, for causing said LED driver to source current when said programmable memory is programmed from a low voltage on said pin, and for causing said LED driver to sink current when said programmable memory is programmed from a high voltage on said pin.

4. The integrated circuit of claim 3 wherein said LED driver comprises:
    a first transistor coupled between a positive voltage supply and said pin; and
    a second transistor coupled between said pin and ground.

5. An integrated circuit comprising:
    a pin for connecting to a LED;
    an LED driver connected to said pin, said LED driver comprising
        a first transistor coupled between a positive voltage supply and said pin, and
        a second transistor coupled between said pin and ground;
    an input buffer connected to said pin;
    a programmable memory coupled to said input buffer;
    means for enabling the input of a voltage on said pin to said programmable memory during a first mode and enabling said LED driver during a second mode; and
    a control circuit, coupled between said programmable memory and said LED driver, for causing said LED driver to source current when said programmable memory is programmed from a low voltage on said pin, and for causing said LED driver to sink current when said programmable memory is programmed from a high voltage on said pin, said control circuit comprising
        a boolean logic circuit having two inputs coupled to an LED drive input;
        a third input of said boolean logic circuit being coupled to an output of said programmable memory; and
        a first inverter coupled between said output of said programmable memory and a fourth input of said boolean logic circuit.

6. The integrated circuit of claim 5 wherein said boolean logic circuit comprises:
    a first AND gate having a first input coupled to said output of said first inverter, a second input coupled to said LED drive input and an output coupled to a control terminal of said first transistor; and
    a second AND gate having a first input coupled to said programmable memory output, a second input coupled to said LED drive input and an output coupled to a control terminal of said second transistor.

7. The integrated circuit of claim 5 further comprising:
    a disabling circuit coupled between said LED drive input and said boolean logic circuit, said disabling circuit having a control input coupled to a power on reset line; and
    an enabling circuit coupled between said input buffer and said programmable memory, said enabling circuit having a control input coupled to said power on reset line.

8. The integrated circuit of claim 7 further comprising:
    a second inverter coupled to said power on reset line; and
    wherein said disabling circuit comprises an AND gate having a first input coupled to said LED drive input and a second input coupled to an output of said second inverter.

9. The integrated circuit of claim 7 further comprising:
    a second inverter coupled to an output of said input buffer; and
    wherein said enabling circuit comprises
        a first AND gate having a first input coupled to said power on reset line, a second input coupled to an output of said input buffer, and an output coupled to a first input of said programmable memory, and
        a second AND gate having a first input coupled to said power on reset line, a second input coupled to an output of said second inverter, and an output coupled to a second input of said programmable memory.

10. An integrated circuit comprising:

a pin for connecting to a LED;

a first LED drive transistor coupled between a positive voltage supply and said pin;

a second LED drive transistor coupled between said pin and ground;

an input buffer connected to said pin;

a programmable memory coupled to said input buffer;

a boolean logic circuit having two inputs coupled to an LED drive input, a first output coupled to a control terminal of said first LED drive transistor and a second output coupled to a control terminal of said second LED drive transistor;

a third input of said boolean logic circuit being coupled to an output of said programmable memory; and a first inverter coupled between said output of said programmable memory and a fourth input of said boolean logic circuit, said boolean logic circuit causing said first LED drive transistor to source current when said programmable memory is programmed from a low voltage on said pin, and causing said second LED drive transistor to sink current when said programmable memory is programmed from a high voltage on said pin; and means for enabling the input of a voltage on said pin to said programmable memory during a power on reset mode and enabling said LED driver during a second, non-power on reset mode.

11. The integrated circuit of claim 10 wherein said boolean logic circuit comprises:

a first AND gate having a first input coupled to said output of said first inverter, a second input coupled to said LED drive input and an output coupled to a control terminal of said first transistor; and a second AND gate having a first input coupled to said programmable memory output, a second input coupled to said LED drive input and an output coupled to a control terminal of said second transistor.

12. The integrated circuit of claim 10 further comprising:

a disabling circuit coupled between said LED drive input and said boolean logic circuit, said disabling circuit having a control input coupled to a power on reset line; and an enabling circuit coupled between said input buffer and said programmable memory, said enabling circuit having a control input coupled to said power on reset line.

13. The integrated circuit of claim 12 further comprising:

a second inverter coupled to said power on reset line; and wherein said disabling circuit comprises an AND gate having a first input coupled to said LED drive input and a second input coupled to an output of said second inverter.

14. The integrated circuit of claim 12 further comprising:

a second inverter coupled to an output of said input buffer; and wherein said enabling circuit comprises a first AND gate having a first input coupled to said power on reset line, a second input coupled to an output of said input buffer, and an output coupled to a first input of said programmable memory, and a second AND gate having a first input coupled to said power on reset line, a second input coupled to an output of said second inverter, and an output coupled to a second input of said programmable memory.

* * * * *